United States Patent [19]
Jäntti et al.

[11] Patent Number: 5,473,284
[45] Date of Patent: Dec. 5, 1995

[54] OSCILLATOR FREQUENCY CONTROL LOOP BASED ON LONG TERM AVERAGE OF FREQUENCY DIFFERENCE

[75] Inventors: Arto Jäntti; Risto Saukkonen; Veli Juola; Lassi Väänänen, all of Oulu, Finland; Tapani Kärki, Upplands-Väsby, Sweden

[73] Assignee: Nokia Telecommunications Oy, Espoo, Finland

[21] Appl. No.: 313,149

[22] PCT Filed: Mar. 30, 1993

[86] PCT No.: PCT/FI93/00129

§ 371 Date: Nov. 30, 1994

§ 102(e) Date: Nov. 30, 1994

[87] PCT Pub. No.: WO93/20619

PCT Pub. Date: Oct. 14, 1993

[30] Foreign Application Priority Data

Apr. 2, 1992 [FI] Finland .................................. 921461

[51] Int. Cl.$^6$ .................................. H03L 1/00; H03L 7/10
[52] U.S. Cl. .................................. 331/10; 331/14; 331/17; 331/25
[58] Field of Search .................................. 331/10, 14, 17, 331/25

[56] References Cited

U.S. PATENT DOCUMENTS

| | | | |
|---|---|---|---|
| 4,511,858 | 4/1985 | Charavit et al. | 331/10 |
| 4,815,109 | 3/1989 | Kao | 331/1 A |
| 4,847,569 | 7/1989 | Dudziak et al. | 331/25 |
| 4,921,467 | 5/1990 | Lax | 331/176 |

FOREIGN PATENT DOCUMENTS

| | | |
|---|---|---|
| 3818726 | 12/1988 | Germany. |
| 3735011 | 4/1989 | Germany. |
| 9016113 | 12/1990 | WIPO. |

*Primary Examiner*—Siegfried H. Grimm
*Attorney, Agent, or Firm*—Cushman Darby & Cushman

[57] ABSTRACT

An oscillator unit for a base station or the like in a digital cellular radio network. The oscillator unit includes an adjustable oven stabilized crystal oscillator (21). The oscillator unit additionally includes a non-volatile memory (27), in which is stored a control information defining the frequency of the oven stabilized crystal oscillator (21) at the start of the oscillator unit, apparatus (30, 31, 32) for deriving a reference frequency from a fixed digital transmission connection, such as a PCM connection, between the base station and the remaining cellular radio network, a frequency control loop (21, 22, 23, 24) for maintaining a long-term stability for the oven stabilized crystal oscillator (21) on the basis of a long-term average of the difference between the frequency of the oven stabilized crystal oscillator and the reference frequency.

9 Claims, 2 Drawing Sheets

OSCILLATOR FREQUENCY CONTROL LOOP BASED ON LONG TERM AVERAGE OF FREQUENCY DIFFERENCE

FIELD OF THE INVENTION

The invention relates to an oscillator unit with an oven stabilized crystal oscillator for a base station or the like in a digital cellular radio network.

BACKGROUND OF THE INVENTION

At a base station of a digital cellular radio system, typically all timing and clock signals are derived from a master clock signal generated locally at the base station. The stability requirement for the master clock signal is 0.05 ppm according to the recommendations of the GSM system, for instance. One approach to meet this stability requirement is to use as master oscillator of the base station a very accurate crystal oscillator, positioned in a space at a stable environmental temperature, a so-called oven. This kind of crystal oscillator is generally called oven stabilized crystal oscillator. A sufficiently accurate oven stabilized crystal oscillator is, however, a very expensive solution, in which long-term instability is inevitable. Consequently, the oven stabilized crystal oscillator must be regularly calibrated to the assigned frequency during operation.

DISCLOSURED OF THE INVENTION

The object of the invention is an oscillator unit with an oven stabilized crystal oscillator, having an improved long-term stability.

This is achieved by means of an oscillator unit, which unit is according to the invention characterized in that the oven stabilized crystal oscillator is adjustable and that the oscillator unit further comprises a non-volatile memory means for storing a control information substantially corresponding to the assigned frequency and defining the frequency of the oven stabilized crystal oscillator at the start of the oscillator unit, a means for deriving a reference frequency from a fixed digital transmission connection between the base station and the remaining cellular radio network, such as a PCM connection, and a frequency control loop for maintaining a long-term stability for the oven stabilized crystal oscillator on the basis of a long-term average of the difference between the frequency of the oven stabilized crystal oscillator and said reference frequency.

In the oscillator unit according to the invention, the oven stabilized crystal oscillator is set at a frequency defined by the stored default control information at the start of the oscillator unit. Thus the oscillator unit reaches a working condition without delay as soon as the oven has warmed up. The oven stabilized crystal oscillator provides a sufficient short-term stability. Long-term stability is obtained by controlling the frequency of the oven stabilized crystal oscillator by means of a reference frequency derived from a digital transmission connection coming to the base station. The frequency of the oscillator is controlled on the basis of a long-term average of the difference between said reference frequency and the frequency of the oven stabilized crystal oscillator. The interval between the adjustments of the oven stabilized crystal oscillator is preferably at least 17.5 minutes to achieve a sufficient capacity of filtering jitter/fluctuation. Thanks to the invention, the accurate cesium norm of a public switched telephone network can be used as a primary long-term frequency norm of the base station. Consequently, the oscillator unit can be provided with an excellent long-term stability, and therefore, the need of calibrating the oscillator unit during operation is reduced or entirely eliminated. Additionally, because only short-term stability is required of the oven stabilized crystal oscillator, it is possible to use a cheaper oven stabilized crystal oscillator than previously. On the other hand, the sufficient shortterm stability of the oven stabilized oscillator guarantees the operation of the oscillator unit, even if the reference frequency derived from the digital transmission connection were temporarily lost. Moreover, the oscillator unit of the invention makes it possible to update the default control information stored for cold starts during operation on the basis of said reference frequency. As result, a frequency error caused by a change of properties of oven stabilized crystal oscillators, e.g. due to an aging of the crystal, can be corrected in connection with possible new cold starts.

BRIEF DESCRIPTION OF THE DRAWINGS

The invention will be explained in the following in greater detail by way of an embodiment with reference to the attached drawings, in which.

A DETAILED DESCRIPTION OF THE INVENTION

Figure 1:
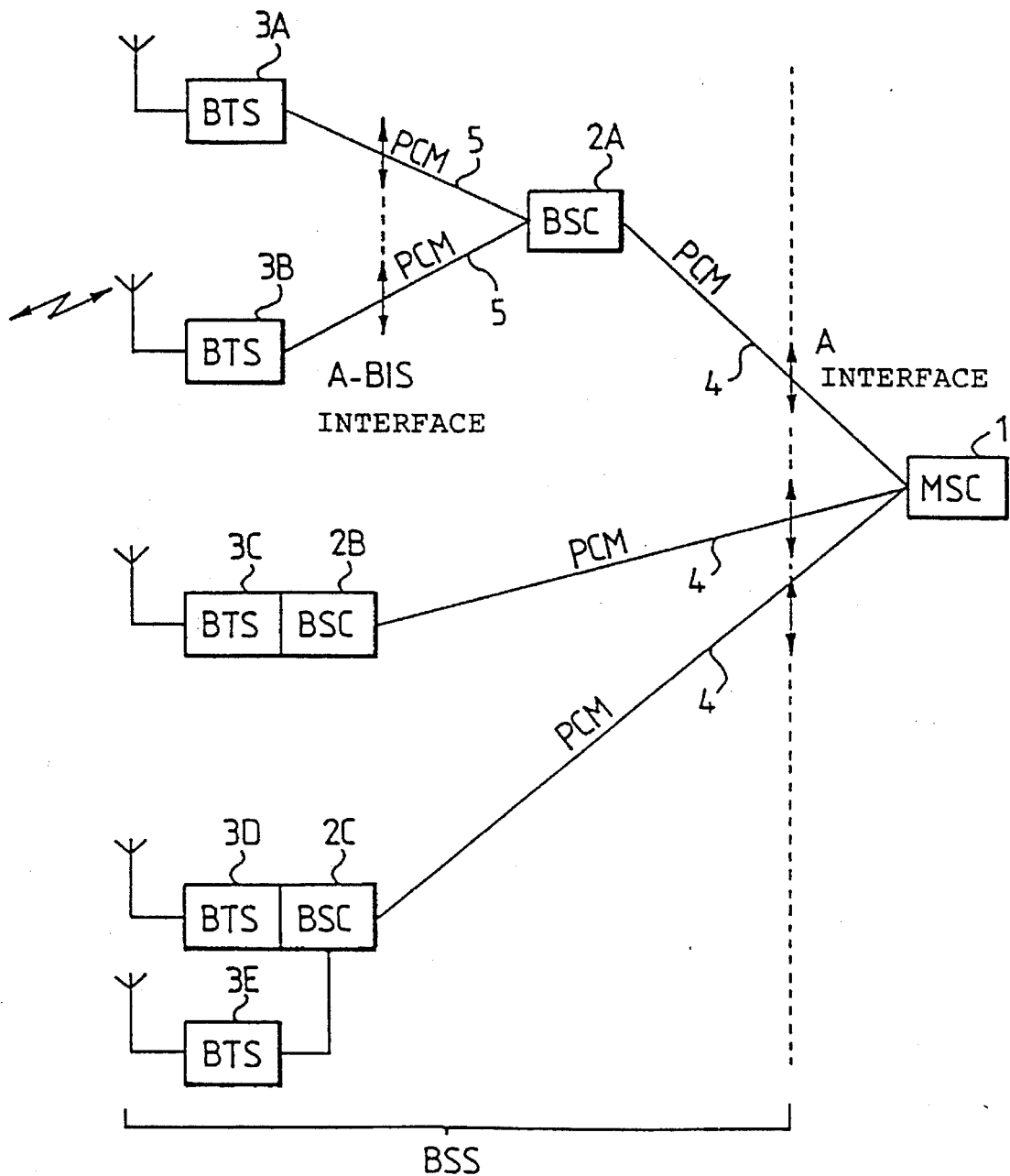
FIG. 1 is a block diagram illustrating a digital cellular radio network, to a base station of which the invention can be applied.

The invention is intended to be primarily applied to digital cellular radio systems. FIG. 1 illustrates a digital GSM mobile radio system. A base station system BSS is under control of a mobile exchange 1 The base station system BSS can comprise one or more base station controllers 2A, 2B and 2C, each controlling one or more base stations 3A, 3B, 3C, 3D and 3E. The base stations BTS are usually situated at a distance from the base station controller BSC, the base stations 3A and 3B from the base station controller 2A. Alternatively, the base station BTS can be positioned in the same location as the base station controller BSC, e.g. the base station 3C in connection with the base station controller 2B. Further, a combination of the two above-mentioned cases is possible, as in connection with the base stations 3D and 3E and the base station controller 2C. The invention can be applied in all types of the base station systems.

Transmission connections 4 between the mobile exchange MSC and the base station controllers BSC are established over the A-interface, where speech and data connections are standard digital PCM connections, e.g. 2 Mb/s (2.048 Mbit/s) or 8 Mb/s (8.192 Mbit/s). Connections and signalling between the base station controller BSC and the base station BTS take place over the A-bis-interface. As a reference frequency of the invention can be used a 2 Mb/s clock signal, which is derived from the PCM connections 5 between the base station controller BSC and the base station established over the A-bis-interface in an interface unit BIE of the base station, or a 8 Mb/s clock signal obtained directly from the base station controller BSC. The invention can be applied to the base station BTS of the GSM system always when the respective base station controller BSC is synchronized with the digital phone exchange MSC over the A-interface.

Figure 2:
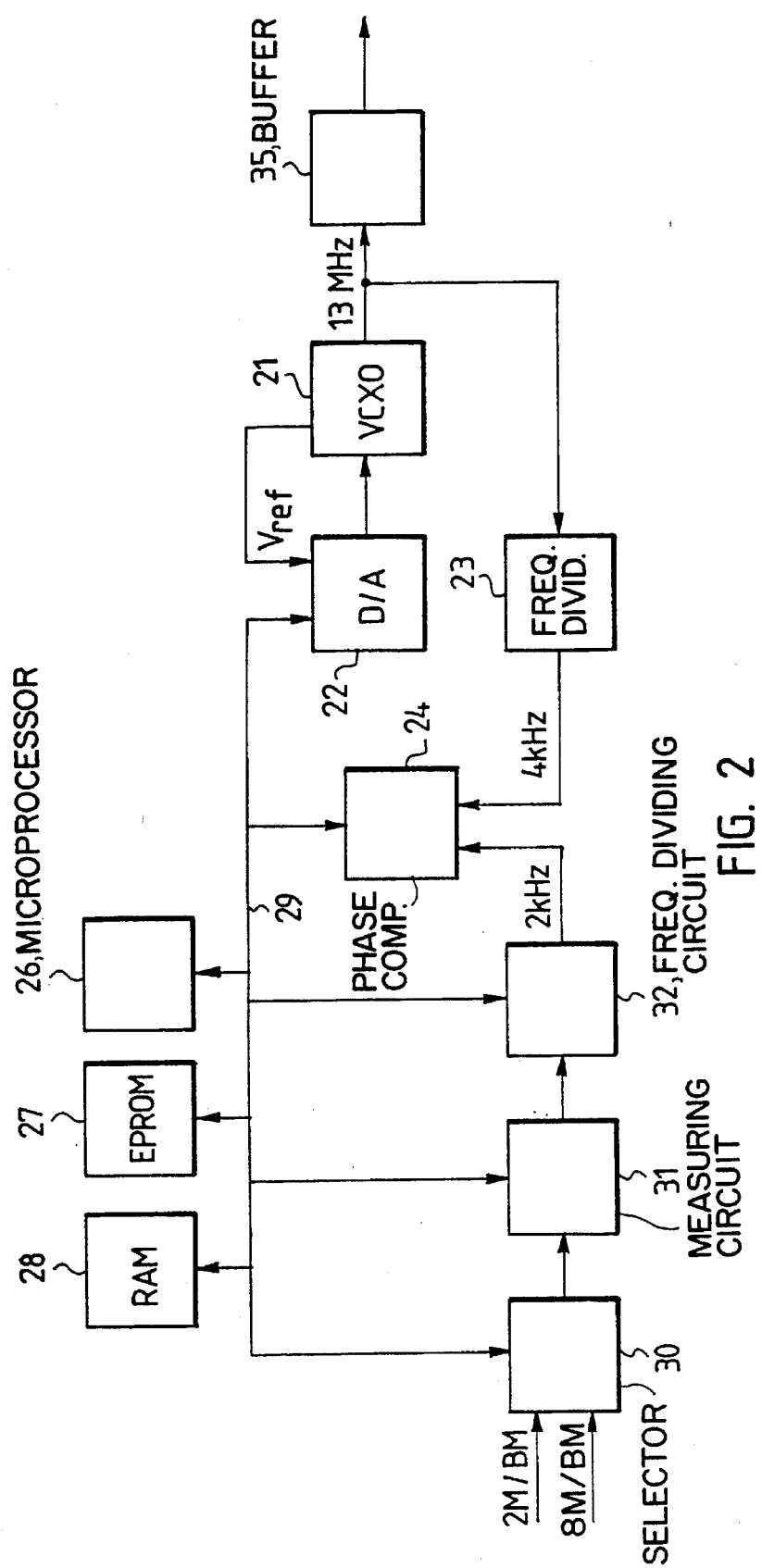
FIG. 2 is a block diagram of an oscillator unit according to the invention.

FIG. 2 shows an oscillator unit according to a primary embodiment of the invention, in which unit a voltage-controlled crystal oscillator is positioned in an environment at constant temperature (oven) in such a way that it forms a so-called oven stabilized crystal oscillator. The short-term stability of the oscillator is at least 0.05 ppm. The oscillator 21 produces a master clock signal with assigned frequency of 13 MHz. The master clock is fed via a buffer 35 to the other devices of the base station. The voltage-controlled oscillator 21 is controlled by the output voltage of a digital-analog converter 22. The voltage is generated by the converter 22 from a digital control value applied by a microprocessor 26 via an address and data bus 29. The reference voltage $V_{ref}$ of the converter 22 has been derived from the reference voltage of the oven stabilized crystal oscillator 21 and it is therefore very stable. In an EEPROM memory 27 is stored a digital control value to be used as a default value for cold start of the oscillator unit. The default value is read by the processor 26 from the memory 27 in connection with a cold start and fed to the digital-analog converter 22, which controls the voltage-controlled oscillator 21 directly to the desired assigned frequency. A default control value stored in the memory 27 at the manufacture is used at the first set up of the oscillator unit and updated or calibrated during operation for later cold starts in a manner to be explained below.

The output frequency of the voltage-controlled oscillator 21 is divided in a frequency dividing circuit 23 by a suitable divisor, e.g. 3250, which produces a 4 kHz signal applied to one input of a phase comparator 24.

A reference clock input of the oscillator unit is formed by a selector circuit 30. The two inputs of a selector circuit 30 receive reference frequencies 2.048 MHz or 8.192 MHz derived from separate PCM connections. Via the bus 29, the microprocessor 26 is able to instruct the selector circuit 30 to select the reference frequency from either of the two inputs. By this solution, the operation of the oscillator unit can be provided with redundancy for a possible failure of the PCM connection. The reference frequency selected by the selector circuit 30 is applied to a measuring circuit 31 and further to a frequency dividing circuit 32. The circuit 32 divides the reference frequency by a suitable divisor in such a way that a frequency of 2 kHz is generated and applied to the other input of the phase comparator 24. By means of the measuring circuit 31, the microprocessor 26 can roughly measure and thereby identify the incoming reference frequency (2.048 MHz or 8.192 MHz). On the basis of the result from the identification, the microprocessor 26 is capable of selecting a divisor suitable for the frequency divider 32, viz. 1024 for the reference frequency of 2.048 MHz or 4096 for the reference frequency of 8.192 MHz.

Because in the primary embodiment of the invention the phase comparator 24 is based on digital counters, the frequencies to be compared shall differ from each other at least an octave. Consequently, the output frequency of the frequency divider 23 shall be at least double the output frequency of the frequency divider 32. On the other hand, using low frequencies of some kilohertz at the comparison makes it possible to use slower and cheaper counter circuits and permits a more accurate phase comparison. At intervals of 10 milliseconds, for instance, the processor 26 reads from the phase comparator 24 digital values representing the phase difference between the signals to be compared and calculates the average of the values obtained during e.g. appr. 2.5 seconds and stores the average value in a RAM memory 28. After having calculated a new average value, the processor 26 calculates the difference between the new average and the previous average and adds the new difference cumulatively to the corresponding differences calculated earlier. After approximately 420 summings, for instance, the processor 26 calculates a new control value for the digital-analog converter 22 on the basis of the accumulated value. When parameters given above as example are used, the microprocessor 26 calculates a new control value at intervals of 17.5 minutes and applies it to the digital-analog converter 22. The updating interval of the control value of the digital-analog converter 22 determines the control time constant for the frequency control in a frequency control loop, which is formed by the oscillator 21, the frequency divider 23, the phase comparator 24, the microprocessor 26 and the digital-analog converter 22. To achieve a sufficient capacity of filtering jitter/fluctuation in the control loop, the control time constant of the control loop shall be of the order of minutes, preferably at least 17.5 minutes. It is also possible to use a lower control time constant than in normal operation when the output frequency of the oscillator 21 differs considerably from the assigned one. In the GSM application, the phase transfer function of the oscillator unit shall be such that the fluctuation and the jitter of the output frequency are low enough to meet the GSM specification when the base station operates in a PCM network environment determined by the CCITT standard 6823.

By means of the control values of the digital-analog converter 22 calculated by the processor, the processor 26 updates also the cold start default value stored in the EEPROM memory 27 to compensate for the errors caused by the ageing of the oscillator 21.

The enclosed figures and the specification relating to them are only intended to illustrate the present invention. As to the details, the oscillator unit of the invention can vary within the scope of the attached claims.

We claim:

1. An oscillator unit for a base station or the like in a digital cellular radio network, which oscillator unit comprises an oven stabilized crystal oscillator (21), characterized in that the oven stabilized crystal oscillator (21) is adjustable and that the oscillator unit further comprises a non-volatile memory means (27) for storing a control information substantially corresponding to the assigned frequency and defining the frequency of the oven stabilized crystal oscillator (21) at the start of the oscillator unit, a means (30, 31, 32) for deriving a reference frequency from a fixed digital transmission connection between the base station and the remaining cellular radio network, such as a PCM connection, a frequency control loop (21, 22, 23, 24) for maintaining a long-term stability for the oven stabilized crystal oscillator (21) on the basis of a long-term average of the difference between the frequency of the oven stabilized crystal oscillator and said reference frequency.

2. An oscillator unit according to claim 1, characterized in that said control information is updated on the basis of a long-term average of the difference between the frequency of the oven stabilized crystal oscillator (21) and said reference frequency.

3. An oscillator unit according to claim 1, characterized in that said oven stabilized crystal oscillator (21) is a voltage-controlled oven stabilized crystal oscillator, and that the frequency control loop comprises a digital-analog converter (22) for generating a control voltage for the oven stabilized crystal oscillator in response to a digital control value inputted to the converter, the interval between two subsequent inputted control values determining the control time constant of the frequency control loop.

4. An oscillator unit according to claim 3, characterized in that said control loop comprises a first frequency dividing means (23) for dividing the frequency of the crystal oscillator with a first divisor and a second frequency dividing means (32) for dividing the frequency of 2048 kHz or 8192 kHz derived from a PCM connection with a second divisor, a digital phase comparator means (24) for producing digital values representing the phase difference between the output signals of the first and the second frequency dividing means, a processor means (26) for reading said digital values and for calculating a new control value for the digital-analog converter (22) on the basis of an average of the digital values read during a predetermined time period.

5. An oscillator unit according to claim 4, characterized in that a reference voltage ($V_{ref}$) of the digital-analog converter (22) is derived from a reference voltage of the oven stabilized oscillator.

6. An oscillator unit according to claim 4, characterized in that the digital phase comparator means (24) is realized by means of digital counters.

7. An oscillator unit according to claim 4, characterized in that the unit comprises means (31) for identifying the reference frequency 2048 kHz or 4×2048=8192 kHz derived from a PCM connection and for setting the divisor of the second frequency dividing means (32) to correspond to the reference frequency.

8. An oscillator unit according to claim 1, characterized in that the unit comprises selector means (30) for selecting the reference frequency from two alternative fixed PCM connections.

9. An oscillator unit according to claim 4, characterized in that the frequency of the oven stabilized oscillator (21) is about 13 MHz, the output frequency of the first frequency dividing means (23) is 4 kHz and the output frequency of the second frequency dividing means (32) is 2 kHz.

* * * * *